United States Patent
Koo et al.

(10) Patent No.: US 7,169,704 B2
(45) Date of Patent: Jan. 30, 2007

(54) METHOD OF CLEANING A SURFACE OF A WATER IN CONNECTION WITH FORMING A BARRIER LAYER OF A SEMICONDUCTOR DEVICE

(75) Inventors: Kyeongmo Koo, Yongin (KR); Jaihyung Won, Sungnam (KR); Hyeonill Um, Sungnam (KR); Sunhyuk Jung, Osan (KR); Sangwook Park, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 45 days.

(21) Appl. No.: 10/175,812

(22) Filed: Jun. 21, 2002

(65) Prior Publication Data

US 2003/0236003 A1    Dec. 25, 2003

(51) Int. Cl.
    *H01L 21/44*    (2006.01)
(52) U.S. Cl. .................. 438/677; 438/710; 438/906; 257/E21.226
(58) Field of Classification Search ............... 438/677, 438/710, 906; 257/E21.226
    See application file for complete search history.

(56) References Cited

U.S. PATENT DOCUMENTS

| | | | |
|---|---|---|---|
| 5,834,371 A | * | 11/1998 | Ameen et al. ............. 438/656 |
| 6,107,192 A | * | 8/2000 | Subrahmanyan et al. ... 438/637 |
| 6,143,128 A | * | 11/2000 | Ameen et al. ......... 156/345.24 |
| 6,365,516 B1 | * | 4/2002 | Frenkel et al. ............. 438/682 |
| 6,563,133 B1 | * | 5/2003 | Tong ........................... 438/455 |
| 6,693,030 B1 | * | 2/2004 | Subrahmanyan et al. ... 438/637 |

FOREIGN PATENT DOCUMENTS

| | | |
|---|---|---|
| JP | 6-97111 | 4/1994 |
| KR | 1999-0054920 | 7/1999 |
| KR | 2000-0073508 | 12/2000 |
| KR | 2001-0032716 | 4/2001 |
| KR | 2001-0033812 | 4/2001 |
| KR | 2001-0039860 | 5/2001 |
| KR | 2001-0044869 | 6/2001 |
| WO | WO 99/28955 | 6/1999 |

OTHER PUBLICATIONS

Chua, et al., "Impact of Voids in Ti-Salicide $p^+$PolySilicon Lines in TiSi$_2$ Electrical Properties", Proceedings of 7$^{th}$ IPFA '99, Singapore, pp. 44-49, ( © 1999 IEEE).
Taguwa, et al., "Low Contact Resistance Metallization for Gigabit Scale DRAM's Using . . . ", IEEE Transactions on Electron Devices, vol. 44, No. 4, pp. 588-594, (Apr. 1997).
Osburn, et al., "The Effects of Titanium Silicide Formation on Dopant Redistribution", J. Electrochem. Soc.: Solid-State Science & Technology, pp. 1490-1504, (Jun. 1988).

* cited by examiner

*Primary Examiner*—Michael Lebentritt
*Assistant Examiner*—Stanetta Isaac
(74) *Attorney, Agent, or Firm*—Lee & Morse, P.C.

(57) ABSTRACT

A method of cleaning a surface of a silicon wafer includes subjecting the surface of the silicon wafer to a hydrogen ($H_2$) gas plasma containing at least one inert gas while biasing the hydrogen plasma with a RF bias power to direct the hydrogen ($H_2$) plasma to clean the surface of the silicon wafer.

12 Claims, 21 Drawing Sheets

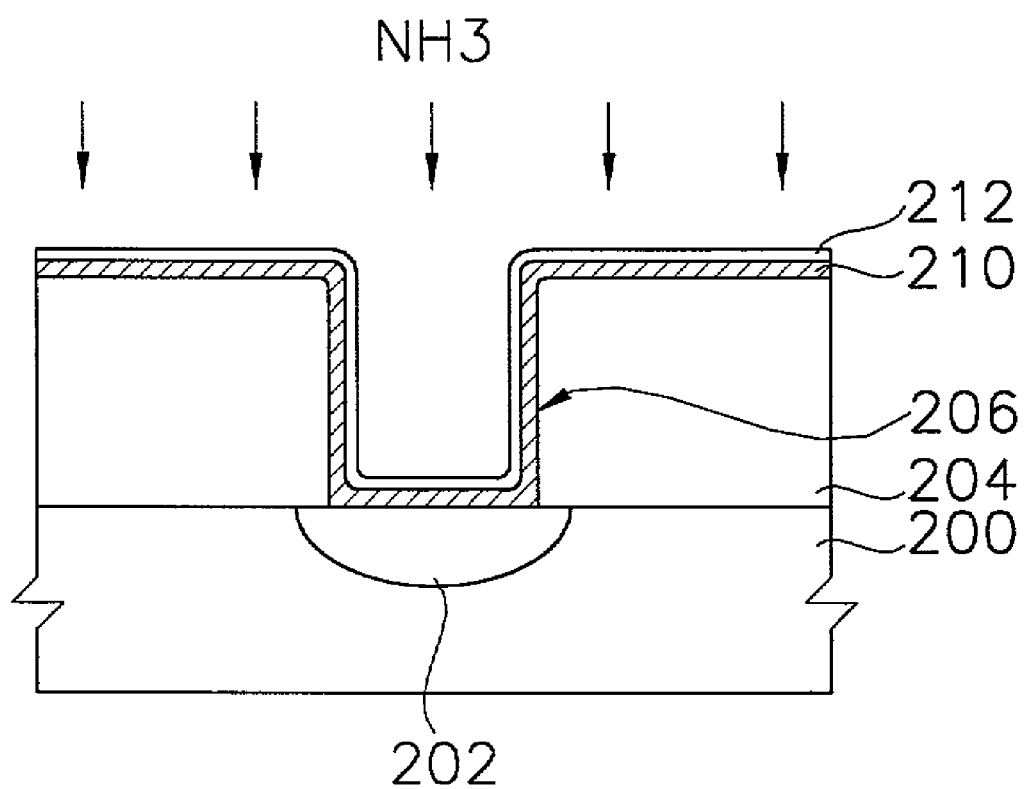

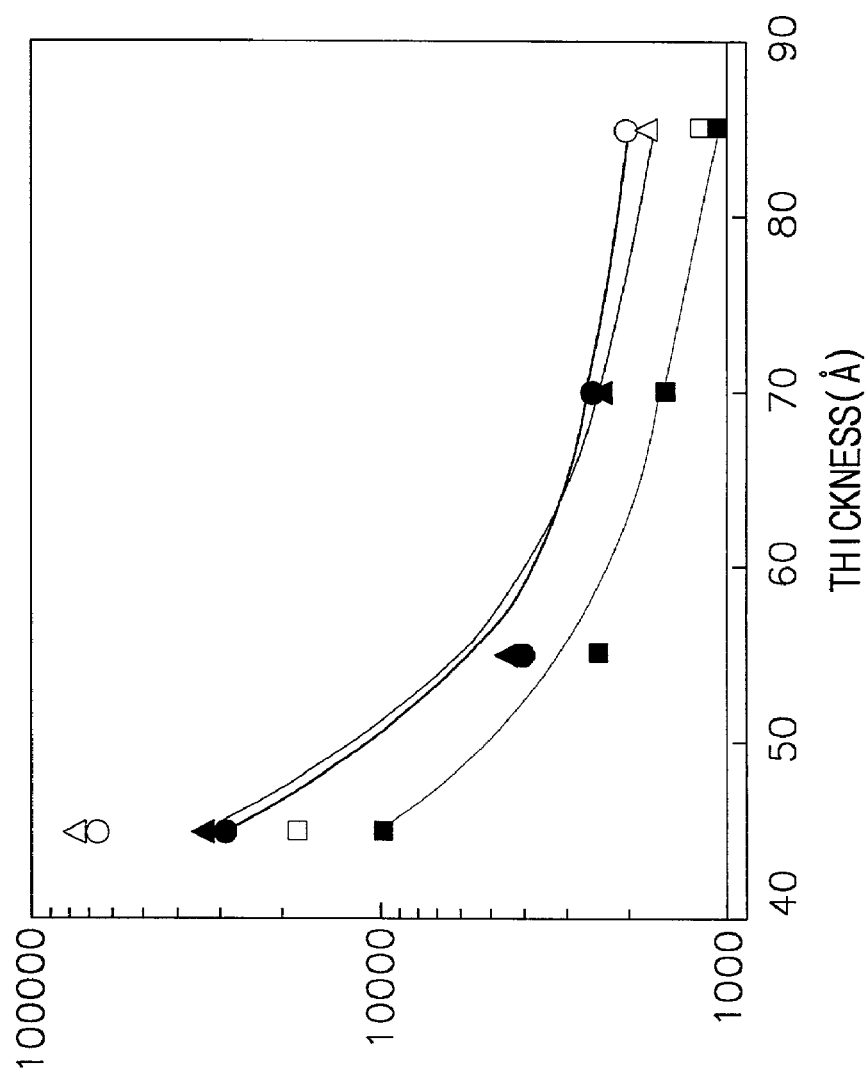

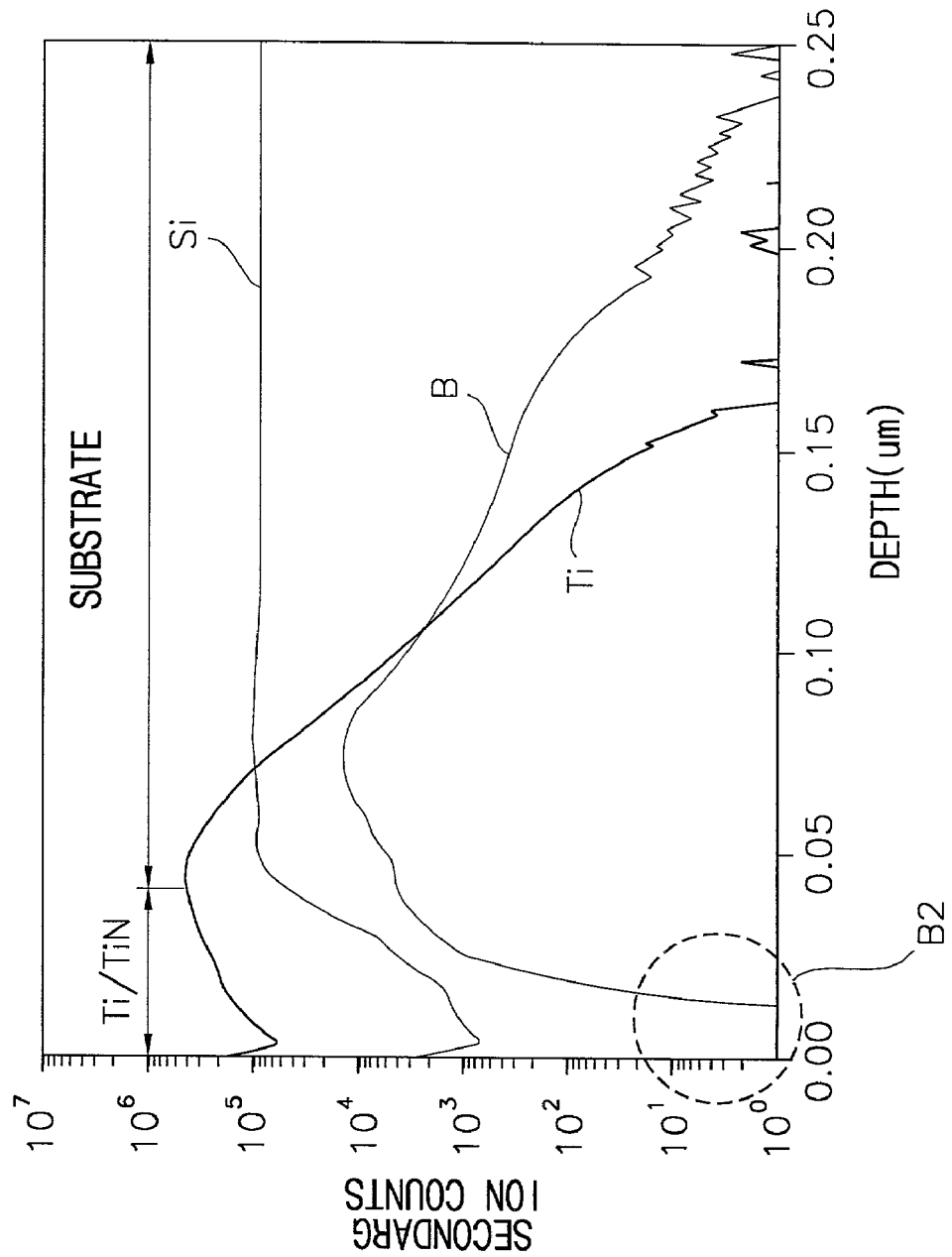

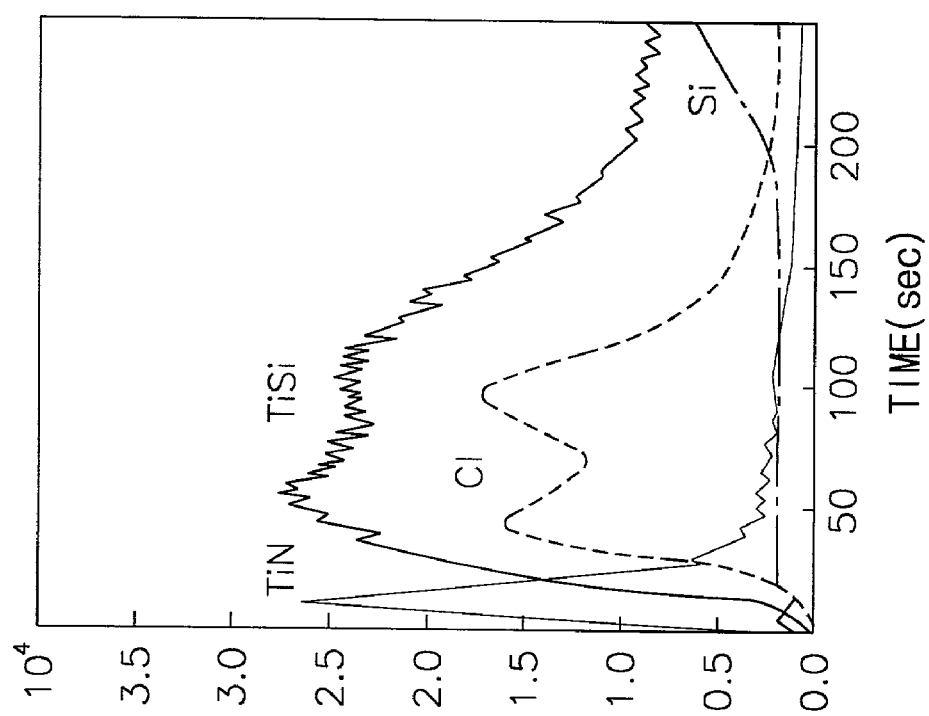

METHOD OF CLEANING A SURFACE OF A WATER IN CONNECTION WITH FORMING A BARRIER LAYER OF A SEMICONDUCTOR DEVICE

BACKGROUND OF THE INVENTION

1. Field of the Invention

The present invention relates to the field of semiconductor device manufacturing and, more particularly, to a method for depositing a barrier layer on a semiconductor device.

2. Description of Background Art

In a semiconductor integrated circuit (IC), a high integration density, forces an attendant reduction in the size of individual device elements, such as a channel length of a transistor, an interval between active areas, a wiring width, a wiring interval and, in particular, a size of an electrical contact pad. To obtain a low contact resistance in such a reduced-sized contact pad, the contact pad is generally formed using a metal silicide layer.

The metal silicide layer serves as an ohmic layer which serves as a low resistance interface between a silicon substrate and a metal layer formed on the silicon substrate. The metal silicide layer also serves as a diffusion barrier layer between a metal layer and an underlying semiconductor region or between two metals in a multilevel metal system, which prevents the diffusion of two materials in the metal layer and the underlying semiconductor region into each other. The metal silicide layer is comprised of a material, such as titanium silicide ($TiSi_2$) or a Group-VIII silicides, such as $PtSi_2$, $PdSi_2$, $CoSi_2$, $NiSi_2$ etc. In a conventional semiconductor device using a design rule of 0.25 micron or less, titanium silicide or cobalt silicide ($CoSi_2$) is widely used for the metal silicide layers.

Typically, after depositing a refractory metal layer using a sputtering process, a heat treatment, such as a rapid thermal process (RTP) is used to form the metal silicide layer at the interface of the refractory metal layer and the exposed silicon region.

However, as an aspect ratio (i.e., depth vs. surface opening hole diameter) of a contact hole increases, the use of the sputtering method results in poor step coverage against the stepped portion having a higher aspect ratio, including poor coverage at the bottom of the hole. Thus, forming a layer of metal silicide of a sufficient thickness at the bottom of the contact hole is difficult.

In order to overcome the difficulties of the step coverage including at the bottom of the contact hole due to the use of the sputtering method, deposition of an intermediate refractory metal layer using a chemical vapor deposition (CVD) or a plasma-enhanced CVD (PE-CVD) process has been employed, wherein a metal silicide layer is formed simultaneously with the deposition of the refractory metal layer. According to this method, even if the aspect ratio of the contact hole is high, the refractory metal reacts with silicon in the active region to form a silicide without a subsequent annealing process and results in good step coverage in a simplified process.

FIG. 1 illustrates a cross-sectional view of a contact hole in a semiconductor device formed by a method for forming a barrier layer of a semiconductor device using the conventional CVD process. Referring to FIG. 1, a heavily doped region 12, e.g., a $P^+$ well, is formed at a surface portion of a semiconductor substrate 10 through an ion-implantation process. An insulating layer 14 is deposited on the substrate 10 and selectively etched via a photolithographic process to form a contact hole 16 in order to partially expose the heavily doped region 12, e.g., the $P^+$ well. During movement of wafer shown in FIG. 1 to another chamber for subsequent processing, a thin native oxide layer 18 grows on the exposed silicon surface due to exposure to an ambient atmosphere.

Thereafter, a refractory metal layer 20, e.g., a titanium (Ti) layer, is deposited on the sidewall and the bottom of the contact hole 16 and the insulating layer 14 via a CVD or a PE-CVD process. During the deposition, a reaction occurs between silicon and titanium at an interface between the titanium layer 20 and the exposed silicon area 12, whereby a titanium silicide ($TiSi_x$) layer is formed. A refractory metal nitride layer, e.g., a titanium nitride (TiN) layer (not shown), is subsequently deposited onto the titanium layer 20 via a CVD process, to form a barrier layer consisting of the titanium layer 20 and the titanium nitride layer. A metal wiring layer 22, comprised of a conductive metal, such as tungsten (W), aluminum (Al) or copper (Cu), is then deposited on the barrier layer and patterned via a photolithographic process or a chemical mechanical polishing (CMP) process to form a metal contact in contact with the heavily doped region 12, e.g., a $P^+$ well.

Disadvantageously, since the heavily doped region 12, e.g., a $P^+$ well, is formed using an ion-implantation process employing $BF_2^+$, dopant concentration of the interface material located between the heavily doped region 12, e.g., a $P^+$ well, and the titanium layer 20 (i.e., the surface portion of the substrate) is reduced due to a diffusion of fluorine (F) and boron (B) caused by the thermal budget used during the formation of the titanium silicide layer. In this reaction, diffused fluorine and boron react with the titanium to form materials having high resistivity, e.g., $TiB_x$ and $TiF_x$, thereby increasing the contact resistance in the heavily doped region 12, e.g., a $P^+$ well. Due to fluorine diffusion, micro-voids are also created in the titanium silicide layer, which further increases the contact resistance of the heavily doped region 12, e.g., a $P^+$ well.

In addition, if the oxide layer 18 that has grown on the exposed silicon surface is not removed before depositing the barrier layer, the formation of the metal silicide layer becomes non-uniform, which further increases the contact resistance. Thus, before depositing the refractory metal layer such as the titanium layer 20, a pre-cleaning process to remove the native oxide layer 18 should be conducted.

Typically, a pre-cleaning process is performed using wet cleaning equipment. However, when the underlying layer of a contact is comprised of a cobalt silicide ($CoSi_2$), a plasma RF etching chamber should be added to a deposition chamber because of the wet bath contamination caused by the pre-cleaning of the barrier layer which creates additional expenses due to retrofitting and loss of process time.

Further, in a case where the titanium silicide is formed by a CVD or PE-CVD process using a $TiCl_4$ source gas, chlorine (Cl) atoms, which are dissociated from the $TiCl_4$ gas, remain as impurities in the titanium silicide layer, and reaction by-products of $TiCl_x$-type compounds are generated in the deposition chamber. During subsequent heating, the chlorine atoms existing at the surface of the titanium silicide layer reacts with titanium or silicon to increase the contact resistance.

SUMMARY OF THE INVENTION

According to preferred embodiments of the present invention, methods for manufacturing a refractory-metal barrier layer in a semiconductor device features a plurality of controlled steps for reducing contact resistance and micro-voids in a plurality of conductive contact pads of the semiconductor device through the use of a hydrogen-based plasma cleaning and deposition process. Activating an argon-hydrogen gas mixture at elevated temperatures in a plasma chamber provides a preferred reactant for reactively removing metal-oxides from a surface of the semiconductor device, in addition to chemically removing embedded surface ion residues of strongly reactive halogens, such as fluorine and chlorine.

In accordance with a preferred embodiment of the present invention, there is provided a method of cleaning a surface of a silicon wafer, including subjecting the surface of the silicon wafer to a hydrogen ($H_2$) plasma containing at least one inert gas while biasing the hydrogen ($H_2$) plasma with a RF bias power to direct the hydrogen plasma to clean the surface of the silicon wafer.

In accordance with another preferred embodiment of the present invention, there is provided a method of forming a barrier layer of a semiconductor device, including subjecting a surface of a semiconductor substrate to a hydrogen plasma containing at least one inert gas while biasing the hydrogen plasma with a RF bias power to direct the hydrogen plasma to the surface of the semiconductor substrate, and thereafter depositing a refractory metal layer on the surface of the substrate. The refractory metal layer may be subject to a nitridation ambient to form a refractory metal nitride layer on a surface portion of the refractory metal layer.

In accordance with yet another embodiment of the present invention, there is provided a method of forming a barrier layer of a semiconductor device, including forming a heavily doped region at a surface portion of a semiconductor substrate, depositing an insulating layer over the semiconductor substrate, forming a contact hole to expose the heavily doped region, subjecting the semiconductor device to a first hydrogen plasma containing at least one inert gas while biasing the hydrogen plasma with a RF bias power to direct the first hydrogen plasma to the surface portion of the semiconductor substrate to remove native oxides, depositing a refractory metal layer on the surface portion of the substrate, subjecting a surface of the refractory metal layer to a second hydrogen plasma containing at least one inert gas while biasing the hydrogen plasma with a RF bias power to direct the second hydrogen plasma to the surface of the refractory metal layer to remove impurities, and thereafter subjecting the refractory metal layer to a nitridation ambient to form a first refractory metal nitride layer on a surface portion of the refractory metal layer. A second refractory metal nitride layer may be formed on the refractory metal nitride layer using a chemical vapor deposition process or a plasma enhanced chemical vapor deposition process. Thereafter, a metal layer may be deposited on the second refractory metal nitride layer while filling the contact hole, and thereafter the metal layer may be patterned.

In accordance with still another embodiment of the present invention, there is provided a method of forming a barrier layer of a semiconductor device, including depositing a refractory metal layer on a semiconductor substrate using a chemical vapor deposition process, subjecting a surface of the refractory metal layer to a hydrogen plasma containing at least one inert gas while biasing the hydrogen plasma with a RF bias power to direct the hydrogen plasma to the surface of the refractory metal layer to remove impurities, and thereafter subjecting the refractory metal layer to a nitridation ambient to form a refractory metal nitride layer on a surface portion of the refractory metal layer. A second refractory metal nitride layer may be formed on the refractory metal nitride layer using a chemical vapor deposition process or a plasma enhanced chemical vapor deposition process.

In accordance with another embodiment of the present invention, there is provided a method of forming a barrier layer of a semiconductor device comprising partially removing impurities existing at a surface portion of a substrate in which the impurities are implanted, and depositing a refractory metal layer on the surface portion of substrate.

In accordance with yet another embodiment of the present invention there is provided a method of forming a barrier layer of a semiconductor device, comprising treating, with a first hydrogen plasma, a substrate in which impurities are implanted to remove an native oxide layer formed on the substrate and simultaneously, to partially remove the impurities existing at a surface portion of the substrate, depositing a refractory metal layer on the surface portion of the substrate, treating, with a second hydrogen plasma, the refractory metal layer to remove impurities in the refractory metal layer, and treating the refractory metal layer in a nitridation ambient to form a refractory metal nitride layer on the refractory metal layer.

These and other features and aspects of the present invention will be readily apparent to those of ordinary skill in the art upon review of the detailed description that follows.

BRIEF DESCRIPTION OF THE DRAWINGS

The above and other objects and advantages of the present invention will become readily apparent by reference to the following detailed description when considered in conjunction with the accompanying drawings wherein:

FIGS. 6A to 6C illustrate cross-sectional views of a semiconductor device showing steps in a process for forming a barrier layer of a semiconductor device according to a second embodiment of the present invention;

FIGS. 8A and 8B are graphs showing n+ contact resistance and P+ contact resistance versus the thickness of a titanium layer;

FIG. 10B shows the depth profile of impurity ions when the hydrogen plasma treatment is carried out;

FIG. 13A is a graph showing the depth profile of chlorine when no hydrogen plasma treatment is performed.

DETAILED DESCRIPTION OF THE INVENTION

Preferred embodiments of the present invention will now be described in detail with reference to the accompanying drawings.

In general, a plasma-enhanced chemical vapor deposition (PECVD) system usually includes a reaction chamber (or a reactor) wherein a deposition occurs. Reaction gas sources are coupled to the reaction chambers through gas feed lines, and mass-flow controllers are provided on the gas feed lines for metering the reaction gases into the reaction chamber. A heater is also provided in the reaction chamber for controlling the wafer temperature. Also, pumps are coupled to the reaction chambers through an outlet line for establishing a reduced pressure and exhausting gases from the reaction chamber. An RF generator is provided for generating a plasma.

Figure 1:
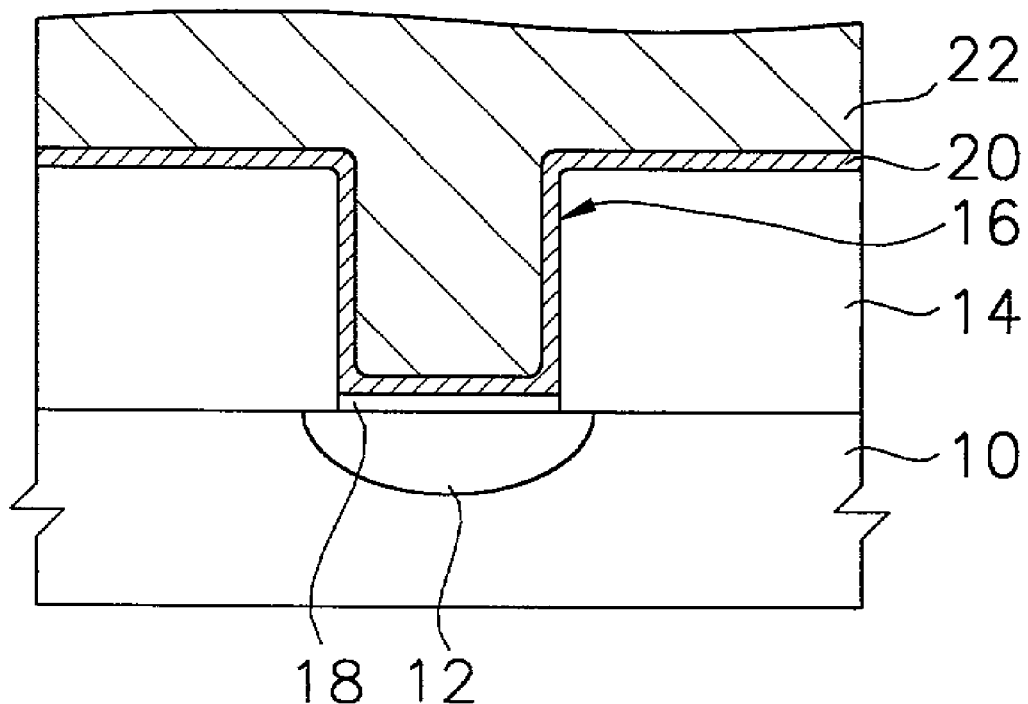
FIG. 1 illustrates a cross-sectional view of a barrier layer of a semiconductor device manufactured using a conventional CVD process.
Figure 2:
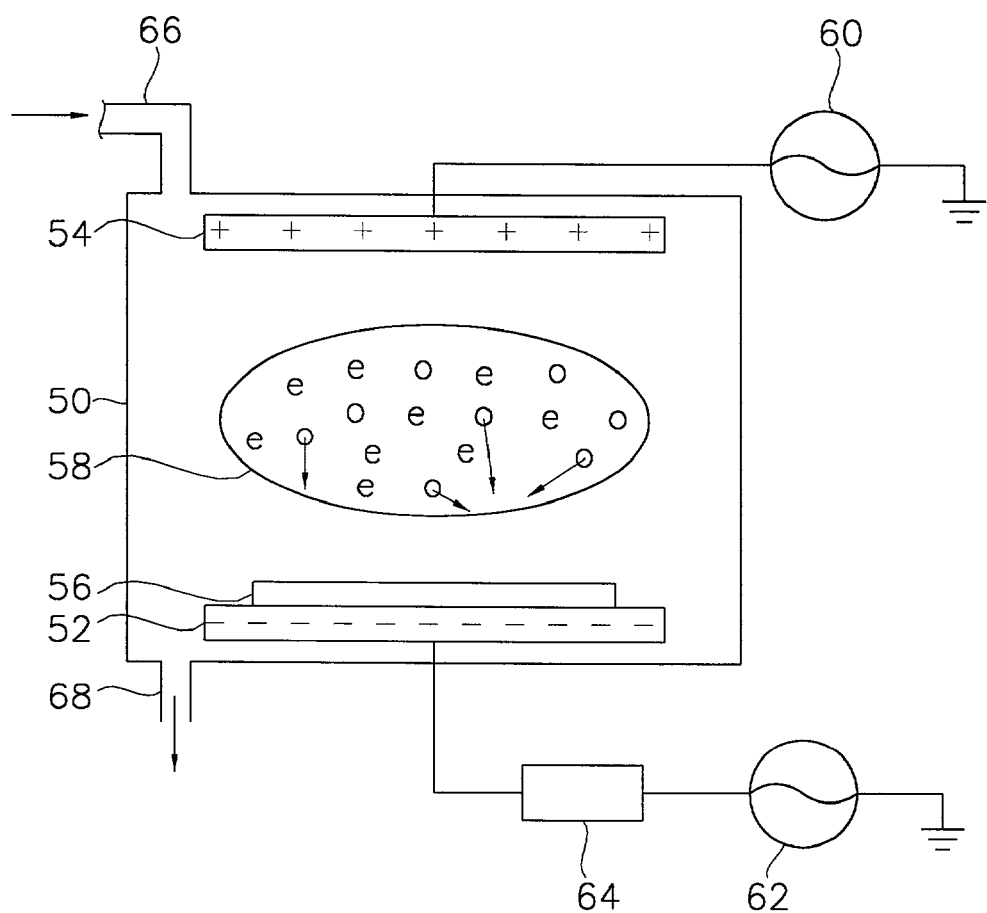
FIG. 2 illustrates a schematic diagram of a refractory metal deposition chamber suitable for performing an in-situ pre-cleaning process in accordance with embodiments of the present invention.

FIG. 2 illustrates a schematic diagram of a refractory metal deposition chamber 50 of a PECVD system suitable for performing in-situ pre-cleaning processes in accordance with various embodiments of the present invention.

Referring to FIG. 2, deposition chamber 50 includes a substrate table 52 for supporting a substrate such as a silicon wafer 56, which is connected to an RF matching network 64 and a first power source 62 for supplying an RF bias power to substrate table 52. The first power source 62 provides the substrate table 52 with a high frequency power of between about 50 W to about 900 W, e.g., 400 W, at between about 13 MHz to 14 MHz, e.g., 13.56 MHz.

A gas inlet 66 is provided for introducing reaction gases such as argon (Ar), hydrogen ($H_2$), CVD source gases, ambient gases, etc. into deposition chamber 50. An RF electrode 54, which is connected to a second power source 60 having an RF plasma power of between about 200 W to 900 W, e.g., 300 W, at a low frequency of between about 400 KHz to 500 KHz, e.g., 460 KHz, is used to generate a plasma 58. The RF plasma power activates a plasma in the reaction gases, and the first power source 62 provides the substrate table 52 with the RF bias to cause the generated plasma 58 to interact with silicon wafer 56. Reaction by-products generated by the interaction are removed from deposition chamber 50 through a vent line 68, typically using a vacuum pump (not shown).

In the present invention, a pre-cleaning process is performed on the silicon wafer 56, wherein contaminants such as native oxides are removed from the silicon wafer 56 in the deposition chamber 50. The native oxides are removed from the surface of the silicon wafer 50 by a sputter etching type process. According to the pre-cleaning process of the present invention, plasma 58 is generated in deposition chamber 50, and ions in the plasma 58 are accelerated by the electric field created by the RF bias supply. The accelerated ions collide with the surface of the wafer 56 to remove the native oxides formed on the surface of the wafer 56.

For example, after heating the silicon water 56 to a temperature of between about 580° C. to about 700° C., the plasma gases, i.e., argon and hydrogen, are introduced into deposition chamber 50 through gas inlet 66. Preferably, a flow rate ratio of the argon gas and the hydrogen is in the range of between about 1:9 to about 2:3. The argon gas is used to ignite the plasma, and the hydrogen gas is used to etch away contaminants such as a native oxide layer formed on the silicon wafer 56. The pressure of deposition chamber 50 is preferably in a range of between about 0.01 Torr to about 10 Torr. Upon application of power sources 60 and 62, electrons and ions of $Ar^+$ and $H^+$ (indicated as "e"s and small circles, respectively, in FIG. 2) are separated from the argon and hydrogen gases to form the activated plasma 58 which is then used to clean the surface of the wafer 56. Actual cleaning time using the hydrogen plasma can vary with varying conditions on the surface of the silicon wafer and can vary from seconds to minutes, but generally a cleaning time of between about 5 seconds to about 5 minutes is sufficient.

Figure 3:
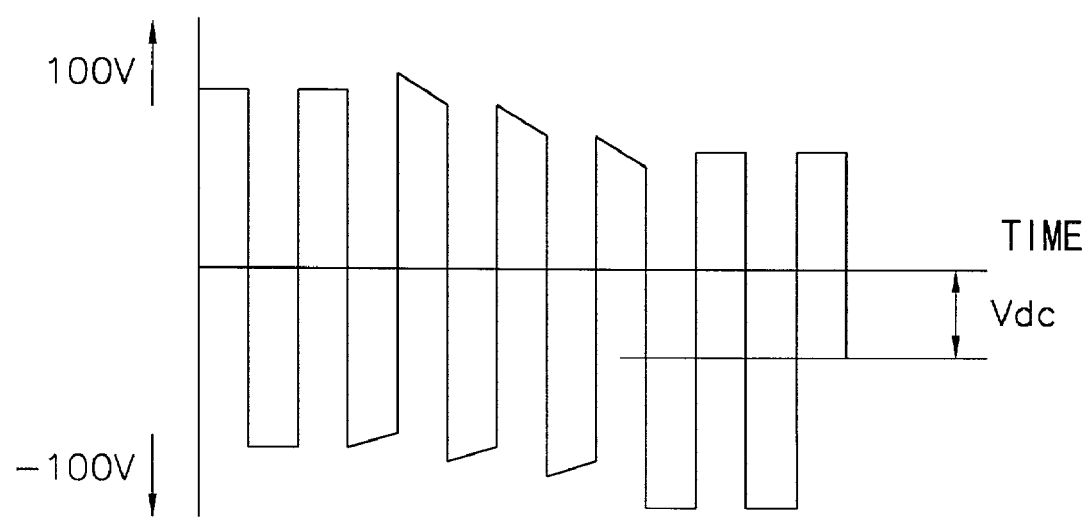
FIG. 3 illustrates a graph showing a voltage waveform after applying an RF power to the chamber of FIG. 2.

FIG. 3 illustrates a graph showing a voltage waveform after applying the RF plasma power and the RF bias power to the chamber 50.

Referring to FIG. 3, with each alternating traversal of RF voltage between positive (+) and negative (−), the Ar+ and H+ ions and the electrons are pulled towards each other or pushed from each other, respectively. Over time, substrate table 52 is self-biased to a negative voltage due to accumulation of electron charges, to thereby generate a potential difference of Vdc. The Ar+ and H+ ions in the plasma 58 are rapidly directed toward the negatively biased wafer 56 and collide with the surface of the wafer 56 to etch the native oxide layer formed thereon. While conventional plasma etching processes use argon plasma for removing the native oxide on the wafer, according to the present invention hydrogen plasma is used for removing the native oxide.

After removing the native oxide layer, a refractory metal layer may be deposited on wafer 56 via a PECVD process in the same chamber 50. Since the same deposition chamber is used for both the in-situ pre-cleaning of the native oxide and the deposition of the refractory metal layer, no extra chamber for performing the pre-cleaning process is needed, and a wet etching process for removing the native oxide layer may be eliminated. Moreover, the hydrogen plasma pre-cleaning treatment partially removes impurities included in the surface portion of the wafer 56 thereby improving the contact resistance of that layer as well.

Figure 4A:
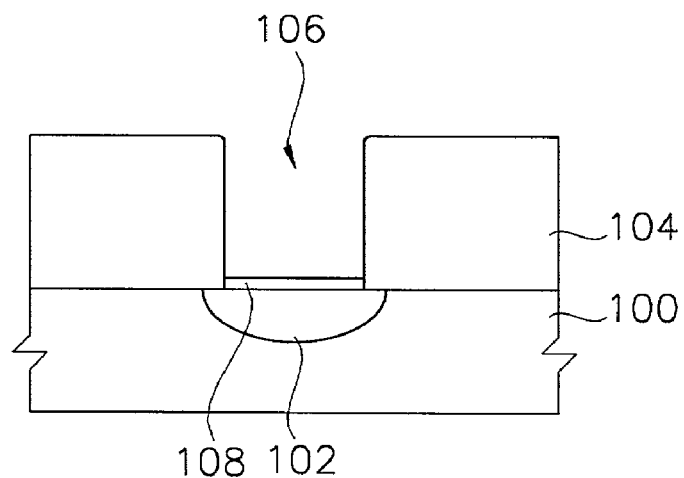
FIGS. 4A and 4B illustrate cross-sectional views of a semiconductor device showing steps in a process for forming a barrier layer of a semiconductor device according to a first embodiment of the present invention.
Figure 4B:
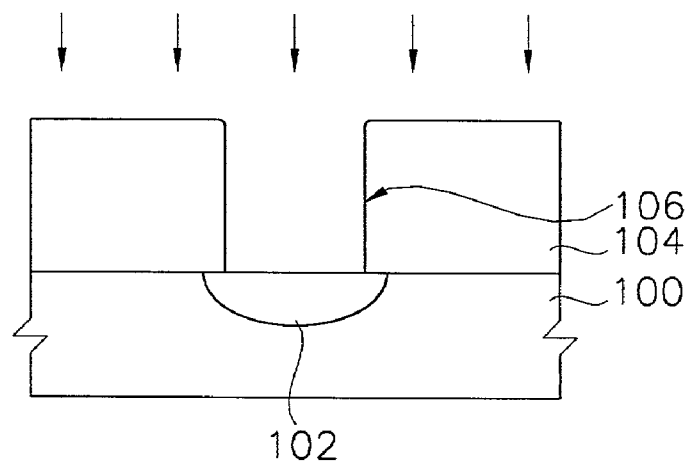

FIGS. 4A and 4B illustrate cross-sectional views of a semiconductor device showing steps in a process for forming a barrier layer of a semiconductor device according to a first embodiment of the present embodiment.

Referring to FIG. 4A, a semiconductor substrate 100 is subjected to an ion-implantation process, thereby forming a heavily doped region 102, e.g., a P+ well, at a surface portion of the semiconductor substrate 100. Preferably, the P+ well 102 is formed by using $BF_2^+$ ion. An insulating layer 104 comprised of an oxide-type material, such as silicon oxide, is then deposited on the semiconductor substrate 100 via a CVD method. The insulating layer 104 is selectively etched via a photolithographic process to form a contact hole 106, which partially exposes the P+ well 102. The silicon surface of the semiconductor substrate 100 at the bottom of the contact hole 106 is thereby exposed to the ambient atmosphere, and a thin native oxide layer 108 grows on the exposed silicon surface of the semiconductor substrate 100.

Referring to FIG. 4B, after forming the contact hole 106, the semiconductor device is moved to a reaction chamber 50 shown in FIG. 2. In the reaction chamber 50, the semiconductor device is treated with a hydrogen plasma at a temperature between about 580° C. to 650° C. for between about 5 seconds to about 5 minutes to remove the native oxide layer 108 from the substrate 100.

Specifically, after loading the semiconductor substrate 100 into the PECVD deposition chamber 50 of FIG. 2, semiconductor substrate 100 is heated to a temperature of about 580 to 650° C. Then, argon gas at a flow rate of about 300 sccm and hydrogen gas at a flow rate of about 2000 sccm are introduced into chamber 50. Since the argon gas is only used for igniting the plasma, only a small quantity is required. The hydrogen gas is used for sputtering native oxide layer 108, and thus a sufficient quantity of hydrogen gas is necessary. The flowing amount of hydrogen gas is preferably greater than the flowing amount of argon gas. Preferably, the flow rate ratio of argon gas and hydrogen gas is in the range of about 1:9 to 4:6. Upon application of the RF bias power of about 400 W at about 13.56 MHz and a RF plasma power of about 300 W at about 460 KHz for between about 5 seconds to 5 minutes, the native oxide layer 108 on substrate 100 is removed.

Figure 5A:
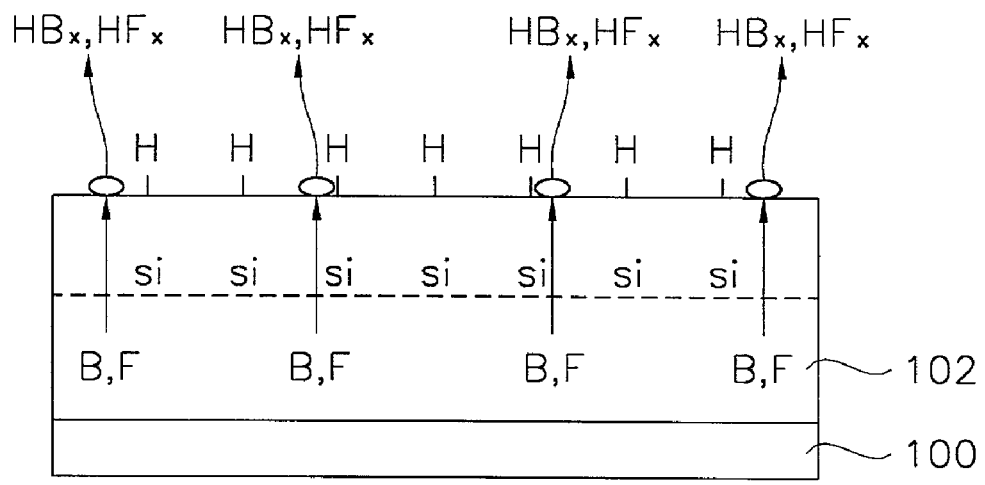
FIG. 5A illustrates a cross-sectional view of a semiconductor substrate after performing a hydrogen plasma treatment in accordance with the present invention.

FIG. 5A illustrates a cross-sectional view of a semiconductor substrate 100 after performing a hydrogen plasma treatment in accordance with the present invention. By performing the hydrogen plasma treatment, fluorine atoms (F) and boron atoms (B) which may exist in P+ well 102 react with the hydrogen atoms to form a compound of $HF_x$ and $HB_x$, respectively, which are evaporated at a temperature of over 600 degrees C. When exhausted via vent line 68, all of the fluorine atoms and a portion of the boron atoms included in the surface portion of the substrate 100 are removed.

Further, the hydrogen plasma treatment prevents the formation of micro-voids caused by the diffusion of fluorine atoms and high resistance compounds such as $TiF_x$ or $TiB_x$, thereby reducing the contact resistance of the P+ region 102. Also, since a metal silicide, such as titanium silicide ($TiSi_x$), is formed on the cleaned surface of substrate 100 after the native oxide is removed by the hydrogen plasma treatment, the contact resistance of P+ region 102 can be further improved.

Figure 5B:
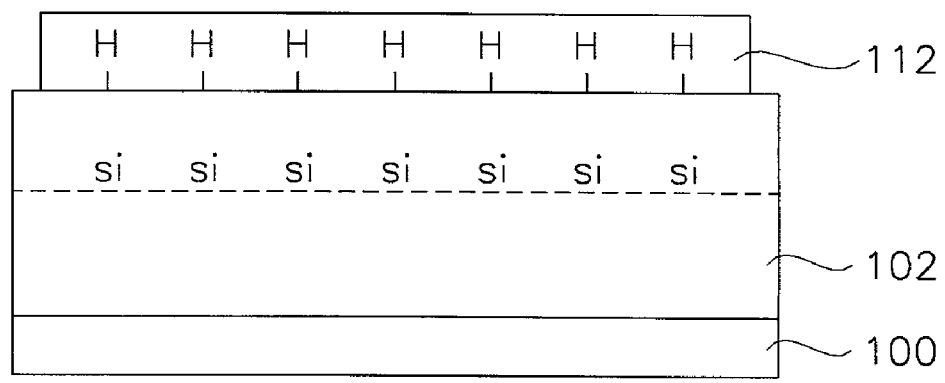
FIG. 5B illustrates a cross-sectional view of the semiconductor substrate on which a barrier layer is deposited after performing the hydrogen plasma treatment.

FIG. 5B illustrates a cross-sectional view of the semiconductor substrate on which a barrier layer is deposited after performing the hydrogen plasma treatment. Since the surface of the substrate 100 is hydrogen-terminated after the hydrogen plasma treatment, the stabilized Si—H bonds are maintained at the surface of the semiconductor substrate 100. During a subsequent metal deposition process, the Si—H bonds are easily broken at the elevated deposition temperature. Thus, the bonding of metal atoms such as Ti atoms to the Si atoms forms a stable $TiSi_x$ compound.

Additionally, due to the hydrogen plasma treatment, the accumulation of chlorine (Cl) is suppressed in a subsequent deposition process using a $TiCl_4$ source gas, thereby preventing potential resistance failures caused by chlorine atoms.

Figure 5C:
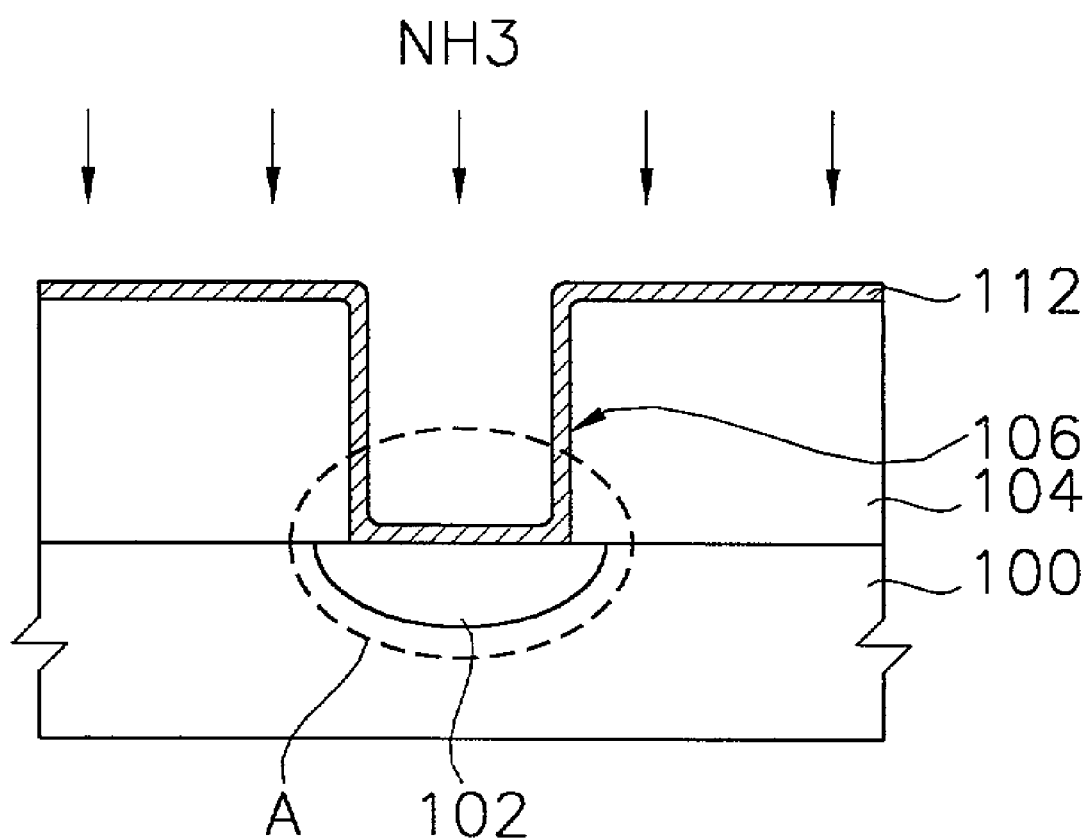
FIG. 5C illustrates a cross-sectional view of a semiconductor device showing the results of a final step in the process of the present invention.

FIGS. 5C illustrates a cross-sectional view of a semiconductor device showing the results of a final step of the process shown in FIGS. 4A and 4B.

Referring to FIG. 5C, after removing native oxide layer 108 and partially removing the impurities at the surface portion of substrate 100 using the hydrogen plasma treatment of the present invention, a refractory metal layer 112, e.g., a titanium (Ti) layer, is deposited on the exposed surface of the wafer. This deposition is made to a thickness of about 40 to about 90 angstroms at a temperature of about 580 ° C. to about 640° C. via a PECVD process on the exposed surface of the semiconductor substrate 100, the sidewall and the bottom of the contact hole 106 and the insulating layer 104.

Specifically, after completing the hydrogen plasma treatment, a depositing source gas, e.g., $TiCl_4$ gas, is introduced into the chamber 50 shown in FIG. 2 at a flow rate of about 4–5 sccm for about thirty seconds. An RF plasma power of about 350 W is applied to the RF electrode while the bias power is grounded to deposit the refractory metal, such as titanium (Ti). A reaction between silicon atoms and the deposited titanium atoms occurs at an interfacial surface of the titanium layer and the exposed silicon area to form a refractory metal silicide layer, such as a titanium silicide ($TiSi_x$).

The titanium layer 112 is then heat-treated or plasma-treated in a nitridation atmosphere, which may be formed by introducing $NH_3$ gas or $N_2$ gas into the reaction chamber. Preferably, $NH_3$ gas is introduced into the reaction chamber at a flow rate of about 300 sccm together with the flow rates for the hydrogen and argon gases as described above. An RF bias power is grounded and a RF plasma power of about 300 W are preferably applied, thereby forming a second plasma in the chamber 50. In reaction to the second plasma, titanium atoms at a surface portion of the titanium layer 112 (noted by circle A in FIG. 5C) is nitrided to form a titanium nitride layer (not shown) on the surface portion of the titanium layer 112. The nitridation using the $NH_3$ plasma is also effective in decreasing any chlorine contents that may be present in the titanium silicide layer.

According to the first embodiment of the present invention, the hydrogen plasma treating process, the titanium depositing process, and the nitridation process are preferably performed in-situ in a single reaction chamber, i.e., in a PECVD deposition chamber.

Figure 6A:
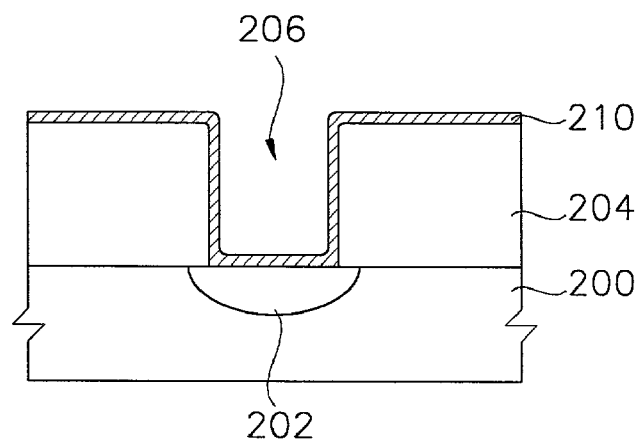
Figure 6B:
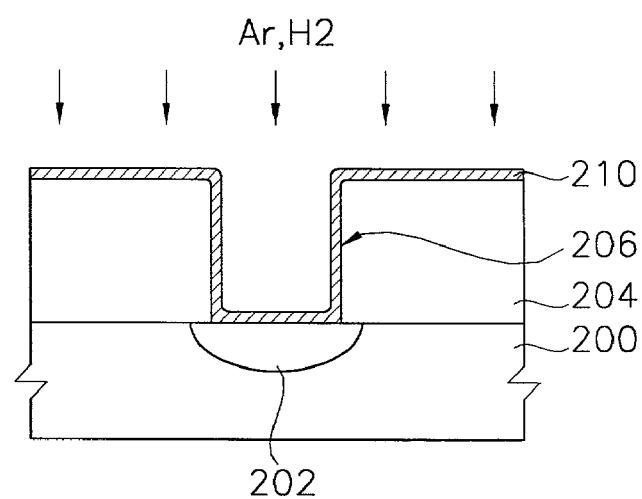

FIGS. 6A to 6C illustrate cross-sectional views of a semiconductor device showing steps in a process for forming a barrier layer of a semiconductor device according to a second embodiment of the present invention. The second embodiment is similar to the first embodiment, except that an additional plasma treatment is performed to remove chlorine atoms remaining in the titanium layer 112 after formation of the titanium layer by a CVD process using $TiCl_4$ gas as a source gas.

FIG. 6A represents the same stage of construction as FIG. 5C of the first embodiment. The predecessor steps, having been fully described in the construction of the first embodiment, will not be repeated here. In FIG. 6A, the prepared assembly includes the following elements, which were constructed according to the first embodiment: substrate 200; P+ well 202, insulating layer 204, contact hole 206, and titanium (Ti) layer 210.

Referring to FIG. 6B, in the second embodiment of the present invention, the titanium layer 210 is treated with a second Ar, $H_2$ plasma at a temperature of about 570° C. to about 700° C. for about 5 to about 10 seconds in order to remove chlorine (Cl) atoms remaining on the surface of titanium silicide layer and the titanium layer 210. Preferably, the second hydrogen plasma treatment is performed in-situ after depositing the titanium layer 210 in the PECVD Ti-deposition chamber 50 (shown in FIG. 2).

Specifically, after forming the titanium layer 210, argon gas and hydrogen gas are introduced into deposition chamber 50 preferably at the same flow rates and flow ratios as in the first embodiment. Then, an RF bias power of about 10~900 W and a RF plasma power of about 200~900 W are applied to form the second plasma composed of $Ar^+$ ions, $H^+$ ions and electrons in the deposition chamber 50. The $H^+$ ions collide with the surface of the titanium layer 210 to 1) remove reaction by-products such as $TiCl_x$ (x=1~4) remaining in the chamber and 2) replace chlorine atoms (Cl) existing at the interface between the titanium suicide layer and the titanium layer with an HCl-type compound, thereby decreasing the remaining quantity of chlorine atoms in the titanium layer 210.

Referring to FIG. 6C, titanium layer 210 is then heat-treated or plasma-treated in a nitridation ambient in the same manner as in FIG. 5C to deposit titanium nitride layer 212. As in the first embodiment, the nitridation using $NH_3$ plasma is effective at decreasing chlorine content in the titanium silicide layer.

In the second embodiment of the present invention, the titanium deposition process, the second hydrogen plasma treatment process, and the nitridation process are preferably performed in-situ in a single reaction chamber, i.e., in a PECVD deposition chamber. Although, in the second embodiment, the second hydrogen plasma treatment process is performed before the nitridation process, in an alternate embodiment, the sequence may be reversed, with the second plasma treatment process being performed after the nitridation process. In either case, the nitridation using $NH_3$ plasma is effective at decreasing chlorine content in the titanium silicide layer FIGS. 7A and 7B illustrate cross-sectional views of a semiconductor device showing steps in a process for forming a barrier layer of a semiconductor device in according to a third embodiment of the present invention.

The third embodiment is similar to the second embodiment but with an additional titanium nitride layer being formed via a CVD method on the titanium nitride layer 212 of FIG. 6C. FIG. 7A represents the same stage of construction as FIG. 6C of the second embodiment. The predecessor steps, having been fully described in the description of the second embodiment, will not be repeated.

Figure 7A:
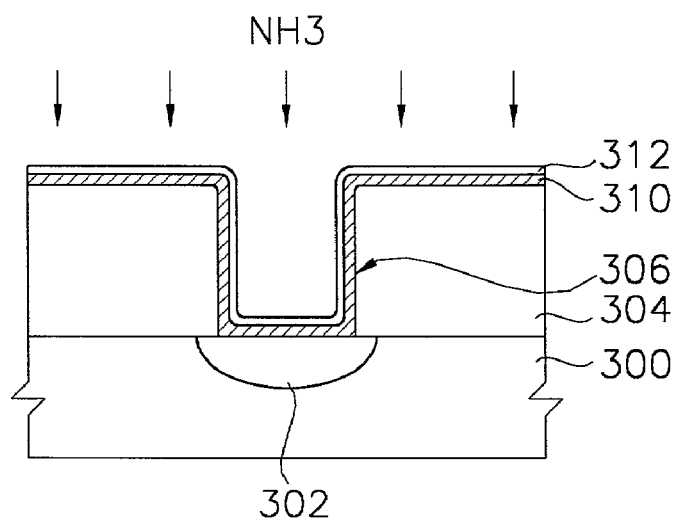
FIGS. 7A to 7B illustrate cross-sectional views of a semiconductor device showing steps in a process for forming a barrier layer of a semiconductor device in accordance with a third embodiment of the present invention.
Figure 7B:
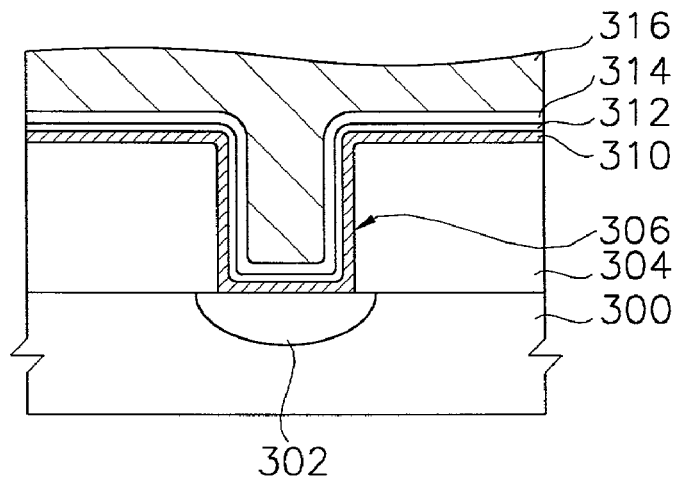

In FIG. 7A, the prepared assembly includes the following elements, which were constructed according to the second embodiment: substrate 300; $P^+$ well 302, insulating layer 304, contact hole 306, titanium (Ti) layer 310, and titanium nitride layer 312.

In the third embodiment, the first hydrogen plasma treatment process, the titanium depositing process, the second hydrogen plasma treatment process and the nitridation process are preferably performed in-situ in a single reaction chamber, i.e., in a PECVD deposition chamber 50.

Referring to FIG. 7B, after completing the nitridation treatment, the substrate 300 is moved to a CVD chamber wherein a second titanium nitride (TiN) layer 314 is deposited via a CVD or a PECVD process on the first titanium nitride layer 312, thereby forming a barrier layer consisting of the titanium layer 310, the first titanium nitride layer 312 as a thermal titanium nitride layer, and the second titanium nitride layer 314 as a CVD titanium nitride layer. The first titanium nitride layer 312 enhances the adhesion between the titanium layer 310 and the second titanium nitride layer 314.

The second titanium nitride layer 314 is formed to a thickness of about 10 to 30 nm, preferably 20 nm, by introducing $TiCl_4$ gas at a flow rate of about 3–50 sccm, $N_2$ gas at a flow rate of about 600 sccm, and $NH_3$ gas at a flow rate of about 50 sccm at a temperature of about 650° C. If only the thermal titanium nitride layer formed by nitriding the titanium layer in a nitridation atmosphere is used as a barrier layer, the thermal budget is preferably controlled in order to obtain a thickness suitable for a barrier layer in CVD (Chemical Vapor Deposition) or PECVD (Plasma Enhanced Chemical Vapor Deposition) process. Alternatively, if the CVD-titanium nitride layer is deposited after forming the titanium nitride layer via a nitridation treatment, the thickness of the thermal titanium nitride layer can be decreased in order to reduce the thermal budget.

Next, a metal such as tungsten (W) or aluminum (Al) is deposited onto the second titanium nitride layer 314 to form a metal layer 316 filling the contact hole 306. The metal layer is patterned via a photolithographic process or a chemical mechanical polishing process, thereby forming the metal contacts on the $P^+$ well 302 in the contact hole 306.

Observation of Contact Resistance

After forming the barrier layer in accordance with the method as in Embodiment 1, tungsten (W) or aluminum (Al) was deposited on the barrier layer to form a metal layer filling the contact hole. The metal layer was patterned to form the metal contacts in the contact hole. Contact resistances were observed with regard to the various contact holes.

Figure 8A:
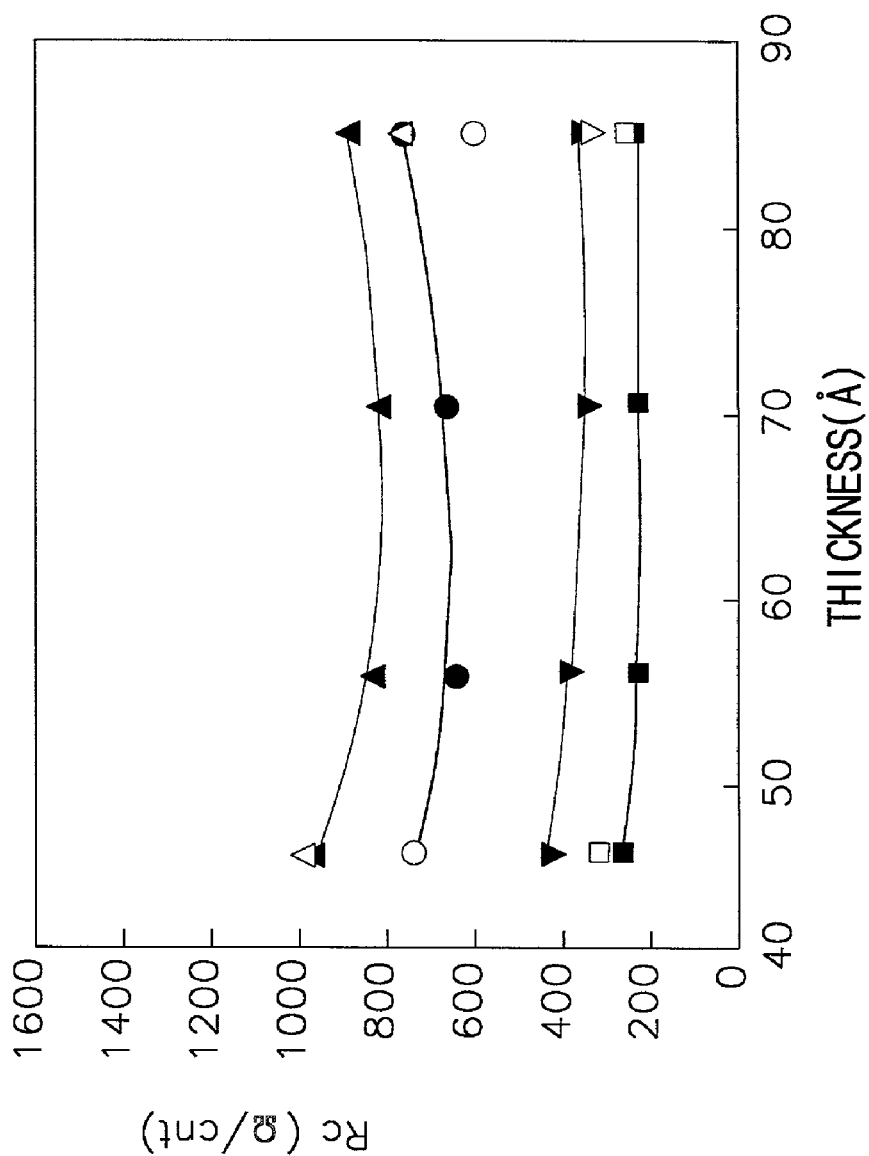

FIGS. 8A and 8B are graphs showing N+ contact resistance and P+ contact resistance versus the thickness of a titanium layer for the Ti deposition temperature. In the graphs, the horizontal axis represents the thickness (in Å unit) and the vertical axis represents the observed contact resistance Rc (in Ω per each contact).

In FIG. 8A, the N+ contact resistances obtained by depositing Ti at the deposition temperature of 615° C. to various thickness and annealing the deposited Ti to form TiN at a temperature of 650° C. are indicated by symbols ⌷, ⌷, ⌷ and ⌷, and the N+ contact resistance by depositing Ti at the deposition temperature of 630° C. to various thickness and annealing the deposited Ti to form TiN at a temperature of 700° C. are indicated by symbols ■, ●, ▲, and ◆. The symbols ⌷ and ■ show the observed contact resistances at the N+ contact having a size of 0.19 μm which was formed at the peripheral region. The symbols ⌷ and ● show the observed contact resistances at the N+ node contact having a size of 0.14~0.15 μm. The symbols ⌷ and ▲ show the observed contact resistances at the Vss contact having a size of 0.16~0.14 μm. The symbols ⌷ and ▲ show the observed contact resistances at the bitline contact having a size of 0.16~0.14 μm.

In FIG. 8B, the P+ contact resistances obtained by depositing Ti at the deposition temperature of 615° C. to various thickness and annealing the deposited Ti to form TiN at a temperature of 650° C. are indicated by symbols ⌷, ⌷ and ⌷, and the P+ contact resistance by depositing Ti at the deposition temperature of 630° C. to various thickness and annealing the deposited Ti to form TiN at a temperature of 700° C. are indicated by symbols ■, ● and ▲. The symbols ⌷ and ■ show the observed contact resistances at the P+ contact having a size of 0.19 μm which was formed at the peripheral region. The symbols ⚑ and ● show the observed contact resistances at the P+ node contact having a size of 0.14~0.15 μm. The symbols ⚐ and ▲ show the observed contact resistances at the Vss contact having a size of 0.16~0.14 μm.

Referring to FIGS. 8A and 8B, the observed contact resistances (Rc) are little varied in accordance with the variation of the deposition temperature, while the observed contact resistances vary in accordance with the variation of the contact size (that is, the contact resistance is lower as the contact size increases). Also, as the thickness of the titanium layer becomes thicker, the contact resistance (Rc) becomes lower.

The reduction of the contact resistance in the p+ contact is greater than in the n+ contact. Thus, it can be noted that the contact resistance becomes lower as the amount of titanium silicide increases.

As for the thickness of the titanium layer, the variation of the P+ contact resistance is larger than that of the N+ contact resistance because the formation of high resistance compounds caused by the P-type impurity, e.g., $TiB_x$ or $TiF_x$, is suppressed by the hydrogen plasma treatment.

Observation of the Leakage Current at the p+ Contact

The barrier layer was formed in accordance with the method as shown and described in the third embodiment of the present invention. Here, the CVD-titanium nitride layer was deposited to a thickness of 20 nm to form a metal layer so as to fill the contact hole 306. The obtained metal layer was patterned to thereby form various metal wirings. Junction leakage was observed on the various contact holes.

Figure 9:
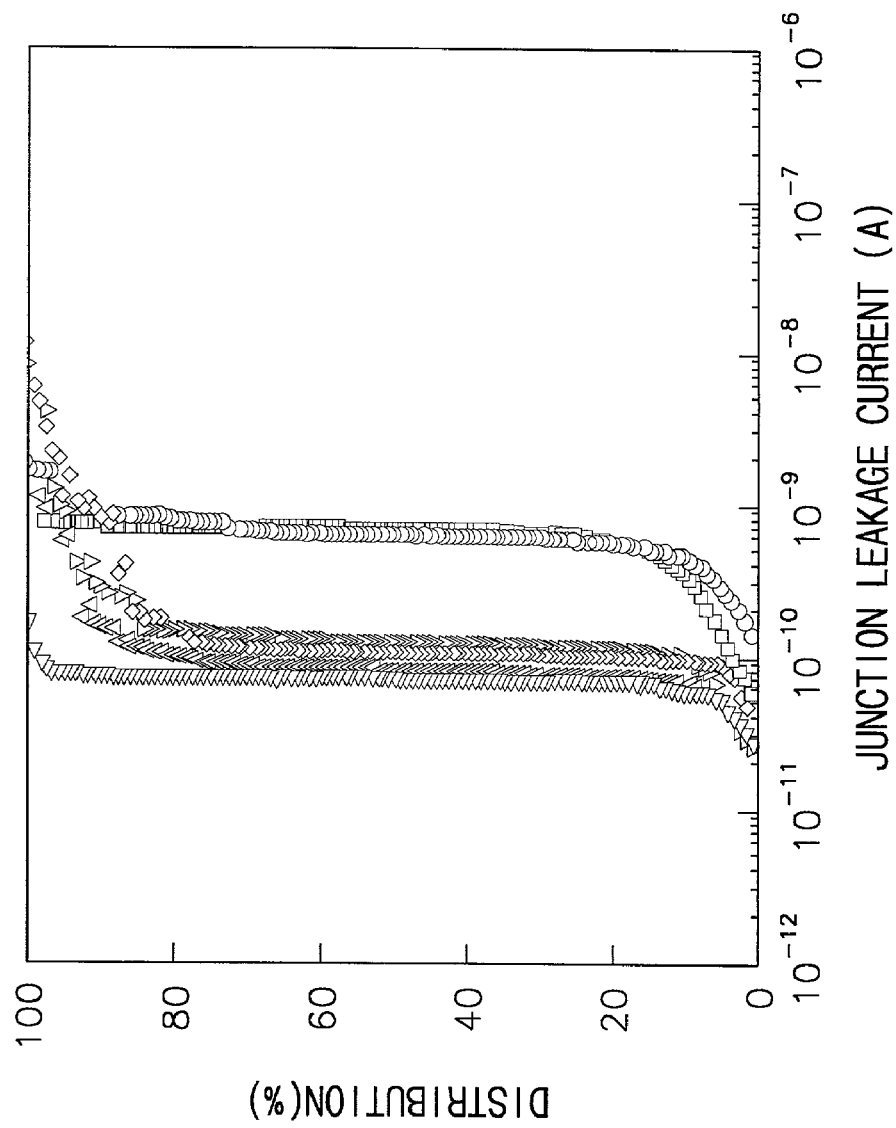
FIG. 9 is a graph showing the junction leakage distribution of P+ contact.

FIG. 9 is a graph showing the junction leakage distribution of P+ contact for the variations of the thickness and the deposition temperature of the titanium layer. Here, the x-axis indicates P+/N junction leakage current (in Ampere), and the y-axis indicates the distribution.

In the graph, the symbol ⚑ shows the junction leakage obtained under the condition that the titanium layer was deposited to a thickness of 45 Å at a temperature of 615° C. and the CVD titanium nitride layer was formed at a temperature of 650° C. The symbol ○ shows the junction leakage obtained under the condition that the titanium layer was deposited to a thickness of 45 Å at a temperature of 630° C. and the CVD titanium nitride layer was formed at a temperature of 700° C. The symbol Δ shows the junction leakage obtained under the condition that the titanium layer was deposited to a thickness of 55 Å at a temperature of 630° C. and the CVD titanium nitride layer was formed at a temperature of 700° C. The symbol ∇ shows the junction leakage obtained under the condition that the titanium layer was deposited to a thickness of 70 Å at a temperature of 630° C. and the CVD titanium nitride layer was formed at a temperature of 700° C. The symbol ◇ shows the junction leakage obtained under the condition that the titanium layer was deposited to a thickness of 85 Å at a temperature of 630° C. and the CVD titanium nitride layer was formed at a temperature of 700° C. The symbol ◁ shows the junction leakage obtained under the condition that the titanium layer was deposited to a thickness of 85 Å at a temperature of 615° C. and the CVD titanium nitride layer was formed at a temperature of 650° C.

Referring to FIG. 9, when the Ti layer was formed to a thickness of 85 Å, the P+/N junction leakage current was increased so as to form a long tail shape in the graph, while the junction leakage characteristic of N+ contact was good. From the viewpoints of the contact resistance and the junction leakage, it was noted that the titanium layer is deposited to a thickness of 85 Å at a temperature of 615° C. and the CVD titanium nitride layer was formed at a temperature of 680° C.

Observation of Impurities

Figure 10A:
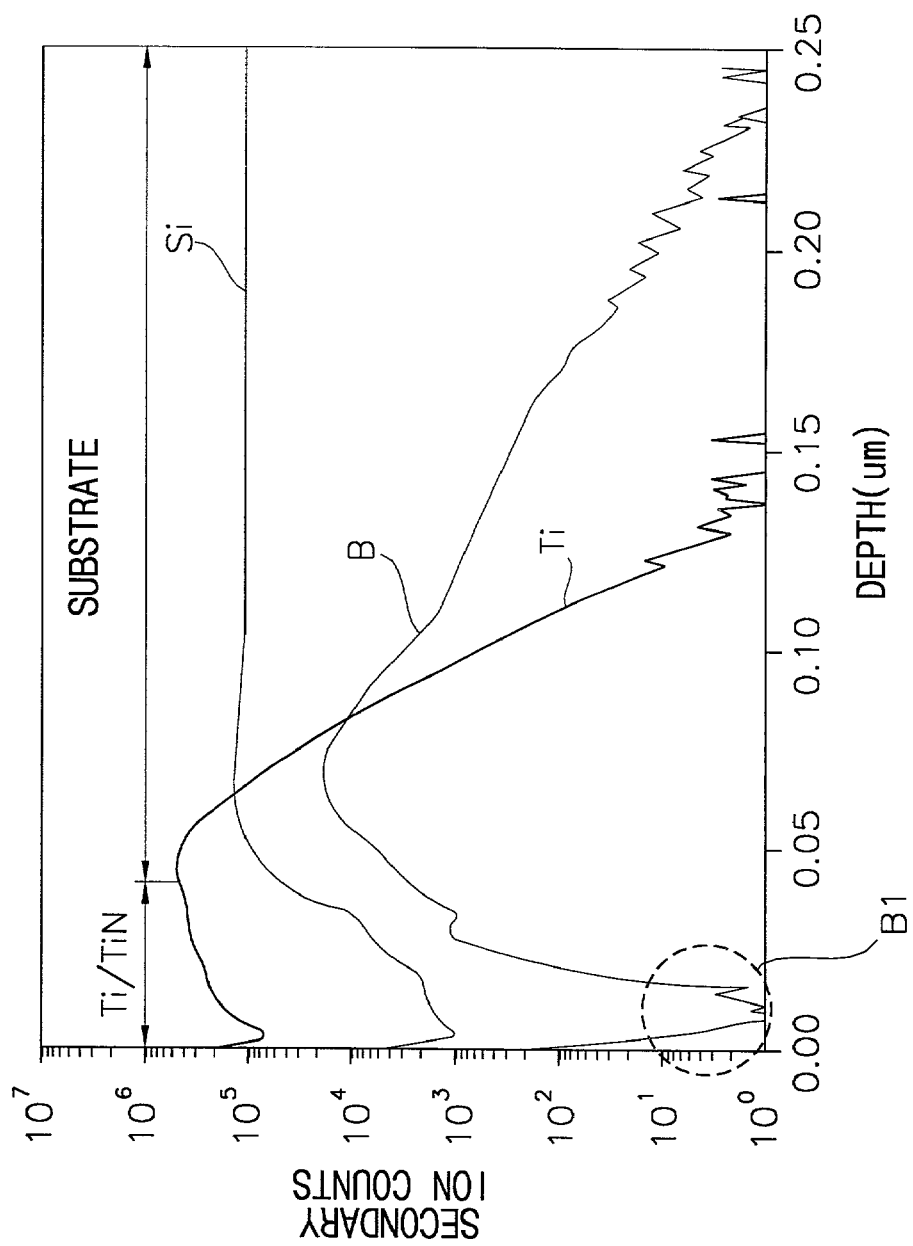
FIG. 10A is a graph showing the depth profile of impurity ions when no hydrogen plasma treatment is performed.

FIG. 10A is a graph showing the depth profile of impurity ions when the hydrogen plasma treatment was not performed, and FIG. 10B shows the depth profile of impurity ions when the hydrogen plasma treatment was carried out. Here, x-axis indicates a depth and y-axis indicates a secondary ion counts.

Referring to FIGS. 10A and 10B, $BF_2^+$ ions are implanted into a surface portion of a bare silicon wafer. The implantation was performed at a tilting angle of 0, an energy level of 25 KeV and the dose of $2.0E15/cm^2$, and the nitrogen annealing was performed at a temperature of 850° C. for 30 min. Then, after performing a hydrogen plasma treatment for 120 sec, a titanium layer was deposited to a thickness of 85 Å at a temperature of 615° C., and then a titanium nitride layer was deposited to a thickness of 200 Å at a temperature of 650° C.

When comparing FIGS. 10A and 10B, silicon counts and boron counts are the same in the silicon substrate, while the titanium counts in FIG. 10B is slightly increased in the silicon substrate as compared with FIG. 10A. Thus, it is noted that the titanium diffuses and penetrates deeply into the silicon substrate while the boron counts is not varied in the titanium silicide region which influences the interface resistance (i.e., contact resistance) between the metal contact and the semiconductor substrate.

As compared with the boron concentration (B1) in FIG. 10A where no hydrogen plasma treatment was performed, the boron concentration (B2) in FIG. 10B is lower in the titanium silicide layer formed at the interface surface of Ti/Si when performing the hydrogen plasma treatment. Thus, it is noted that the generation of the high resistance compounds such as $TiB_x$ was suppressed by the hydrogen plasma treatment.

Etching Quantity Measurement by the Hydrogen Plasma Treatment

Figure 11A:
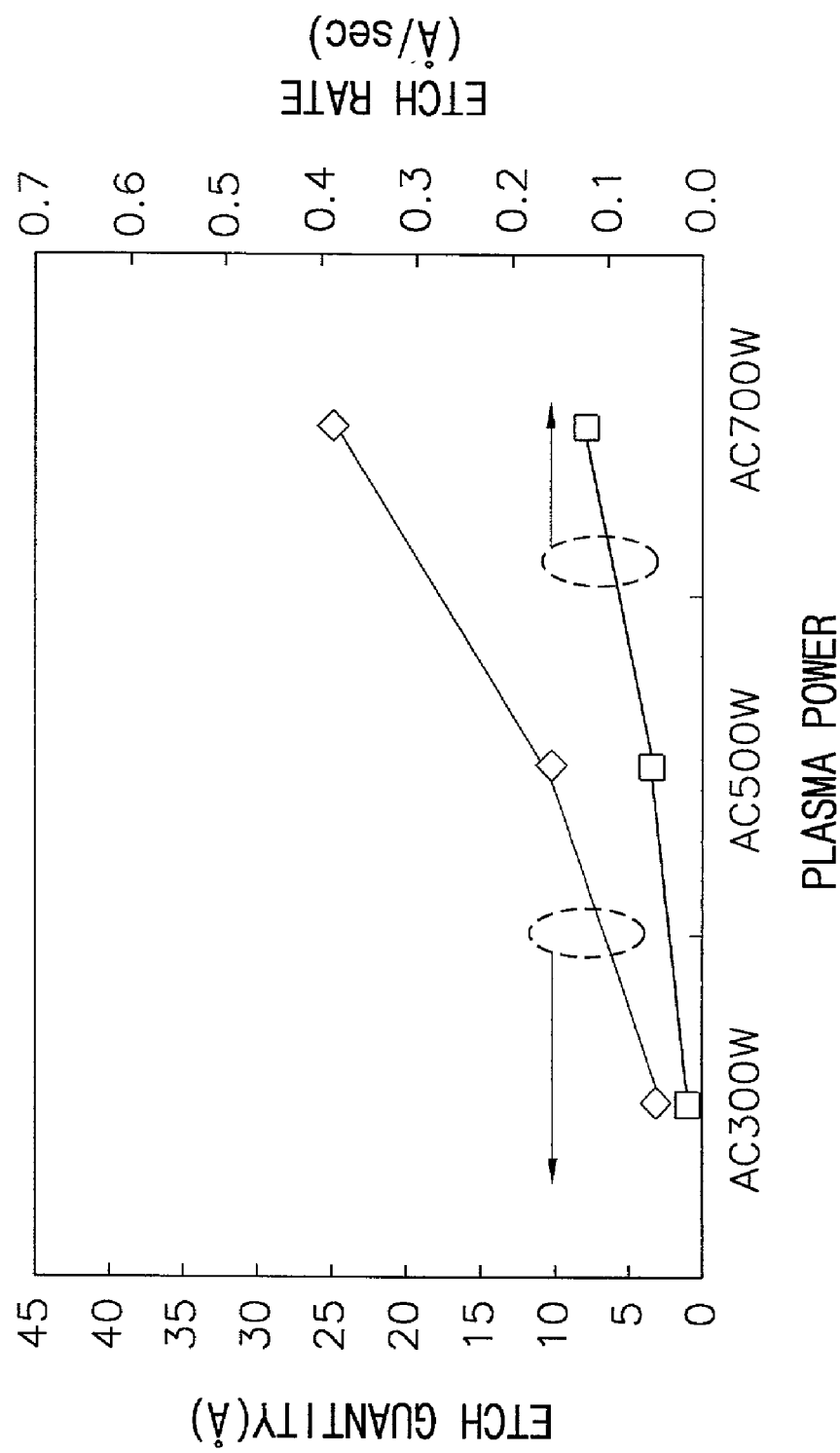
FIG. 11A is a graph showing an etch quantity of a native oxide layer versus an RF plasma power of PECVD-Ti deposition chamber.
Figure 11B:
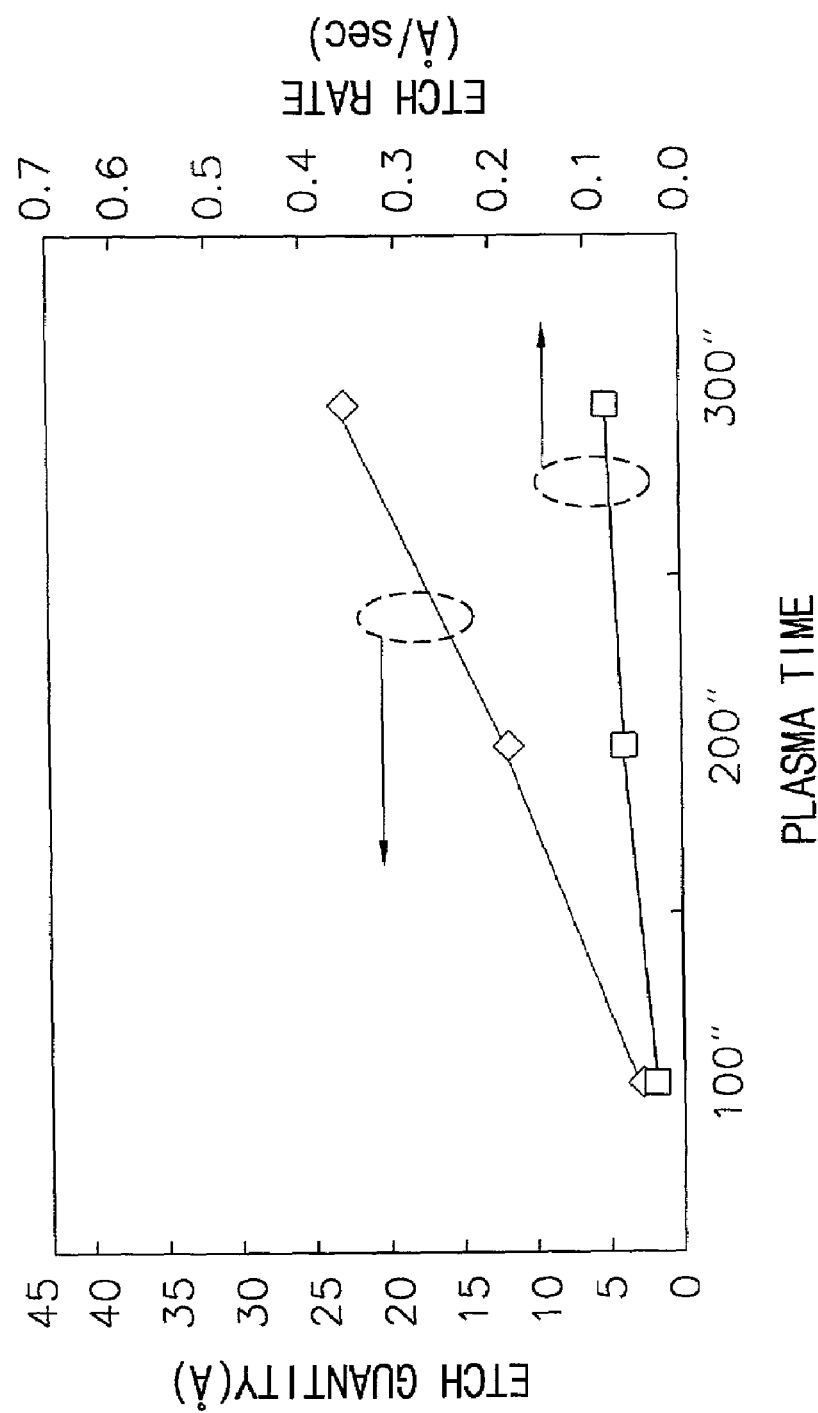
FIG. 11B is a graph showing an etch quantity of the native oxide layer versus the plasma etching time.

FIG. 11A is a graph showing an etch quantity of a native oxide layer versus an RF plasma power of PECVD-Ti deposition chamber, and FIG. 11B is a graph showing an etch quantity of the native oxide layer versus the plasma etching time.

Referring to FIGS. 11A and 11B, a thermal oxide layer was grown to a thickness of 1000 Å on a bare silicon wafer. Then, a hydrogen plasma treatment was performed by applying various RF plasma powers of 300 W, 500 W and 700 W to the silicon wafer for a plasma etching time of 200 sec (FIG. 11A) and by applying the RF plasma power of 500 W for various plasma etching times of 100 sec, 200 sec and 300 sec (FIG. 11B).

As the RF plasma power or the plasma etching time increases, the etch quantity of the native oxide layer also increases. Therefore, by controlling the RF plasma power for activating the plasma in the PECVD chamber, the thin native oxide layer formed on the silicon substrate can be sufficiently removed.

Chlorine Content Measurement

Figure 12:
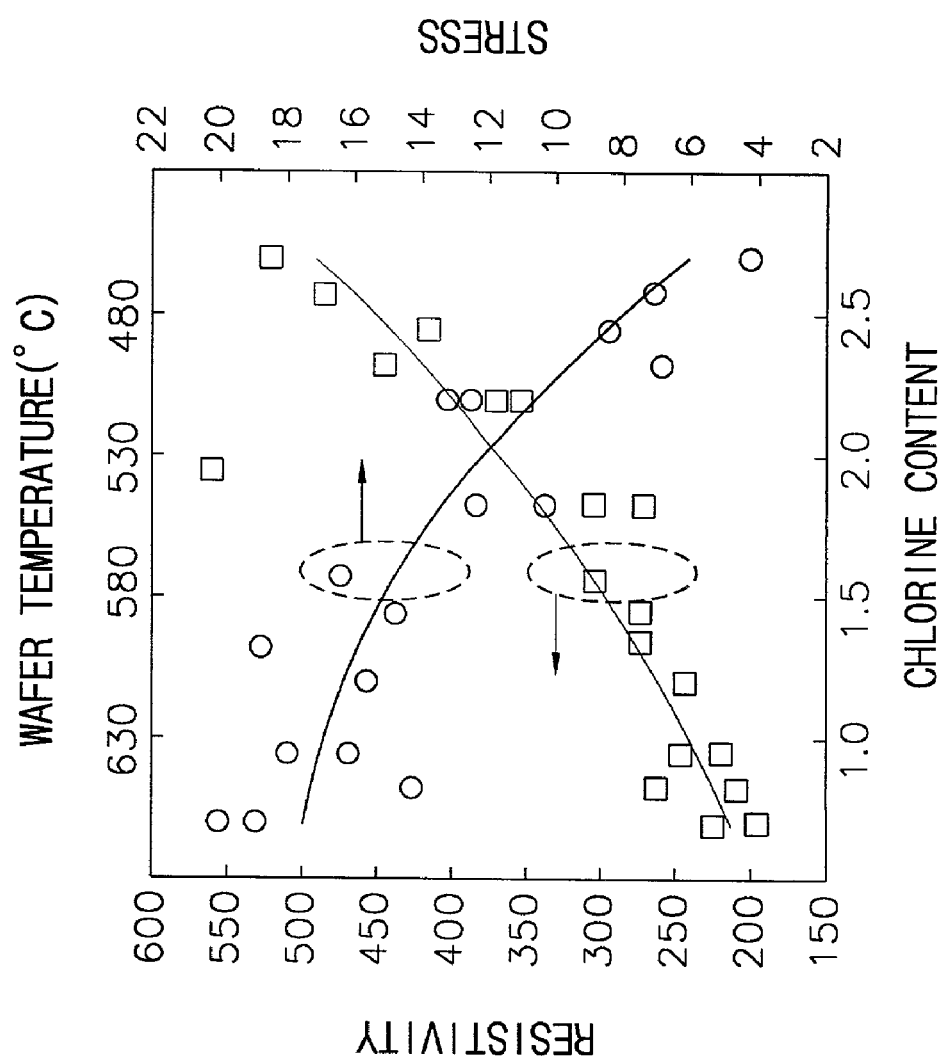
FIG. 12 is a graph showing the resistivity and stress of a titanium suicide layer versus chlorine contents.

FIG. 12 is a graph showing the resistivity and stress of a titanium silicide layer versus chlorine content. Here, an upper axis denotes a wafer temperature while a lower axis denotes chlorine content (in atomic percent). A left axis denotes a resistivity ($\Omega/cm$) of the titanium silicide layer while a right axis shows a stress ($\times 10E9$ $dyn/cm^2$) thereof.

In FIG. 12, symbol ○ denotes the observed stress variations, and symbol □ denotes the observed resistivity variations.

Referring to FIG. 12, as the chlorine content increases in the titanium silicide layer, the resistivity of the titanium silicide layer increases while the film stress is decreased. Accordingly, when the chlorine content is optimized to a suitable level, the titanium silicide layer having low resistivity and low stress can be obtained.

Figure 13B:
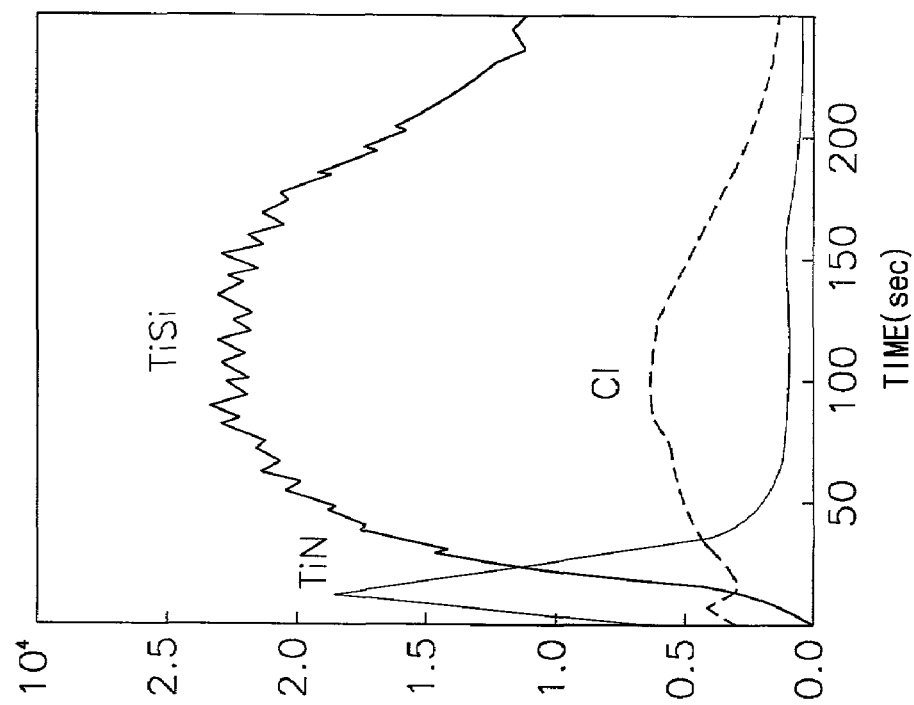
FIG. 13B shows the depth profile of chlorine when a second hydrogen plasma treatment is performed.

FIGS. 13A and 13B are graphs showing the depth profile of chlorine atoms for the second hydrogen plasma treatment by measuring the atomic quantity by a SIMS analysis method.

FIG. 13A shows the relative detected amounts of various components such as TiSi, Cl, Si and TiN with lapse of time when the etching with respect to the barrier layer was performed. The barrier layer was formed by depositing a titanium layer to a thickness of 75 Å, and the surface of the titanium layer was nitrided as in the first embodiment. Here, the hydrogen plasma treatment was not performed.

FIG. 13B shows the relative detected amounts of various components such as TiSi, Cl, and TiN with lapse of time when the etching with respect to the barrier layer was performed. The barrier layer was formed by depositing a titanium layer to a thickness of 75 Å, and the surface of the titanium layer was nitrided as in the first embodiment. Here, the hydrogen plasma treatment as described in the context of the second embodiment was performed.

Referring to FIG. 13B, when the second hydrogen plasma treatment was performed, the detected chlorine quantity was reduced. From the comparison of FIGS. 13A and 13B, it can be noted that chlorine existing in the interface of the titanium silicide layer and the titanium layer was partially removed, as HCl type compound and reaction by-products such as TiClx remaining in the PECVD Ti-deposition chamber are decomposed and diluted by H+ ions. Accordingly, it can be assured that the chlorine contents in the titanium silicide layer were decreased to improve the contact resistance.

After depositing a titanium layer as described in connection with the first embodiment, the titanium layer was subjected to heat treatment which was performed at a temperature of 60~800° C.

Figure 14:
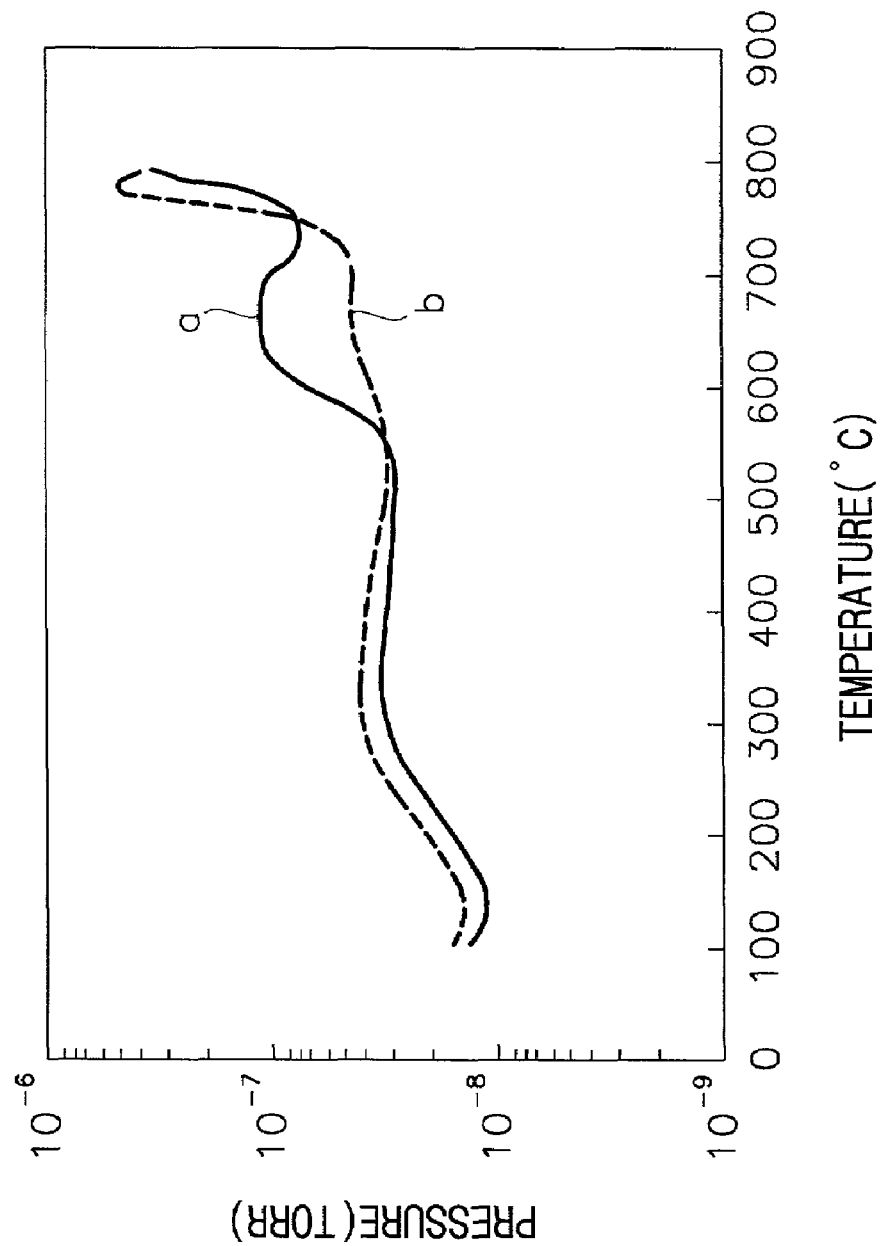
FIG. 14 shows chlorine contents outgassing in a titanium silicide layer when a titanium layer is heat-treated.

In the case of line a of FIG. 14, where only Ti deposition was carried out without the second hydrogen plasma treatment, the partial pressure of chlorine increased at a temperature in the vicinity of about 570° C., while the partial pressure of chlorine decreased at a temperature of over 710° C.

In the case of line b of FIG. 14 where the second hydrogen plasma treatment was performed in the same manner as described in connection with the second embodiment, the increase of chlorine partial pressure is largely reduced as compared to the case of line a. Thus, it is noted that chlorine bondings in the surface of the titanium silicide layer was removed as HCl type compound and reaction by-products such as TiClx remaining in the deposition chamber were removed via the second hydrogen plasma treatment.

Figure 15:
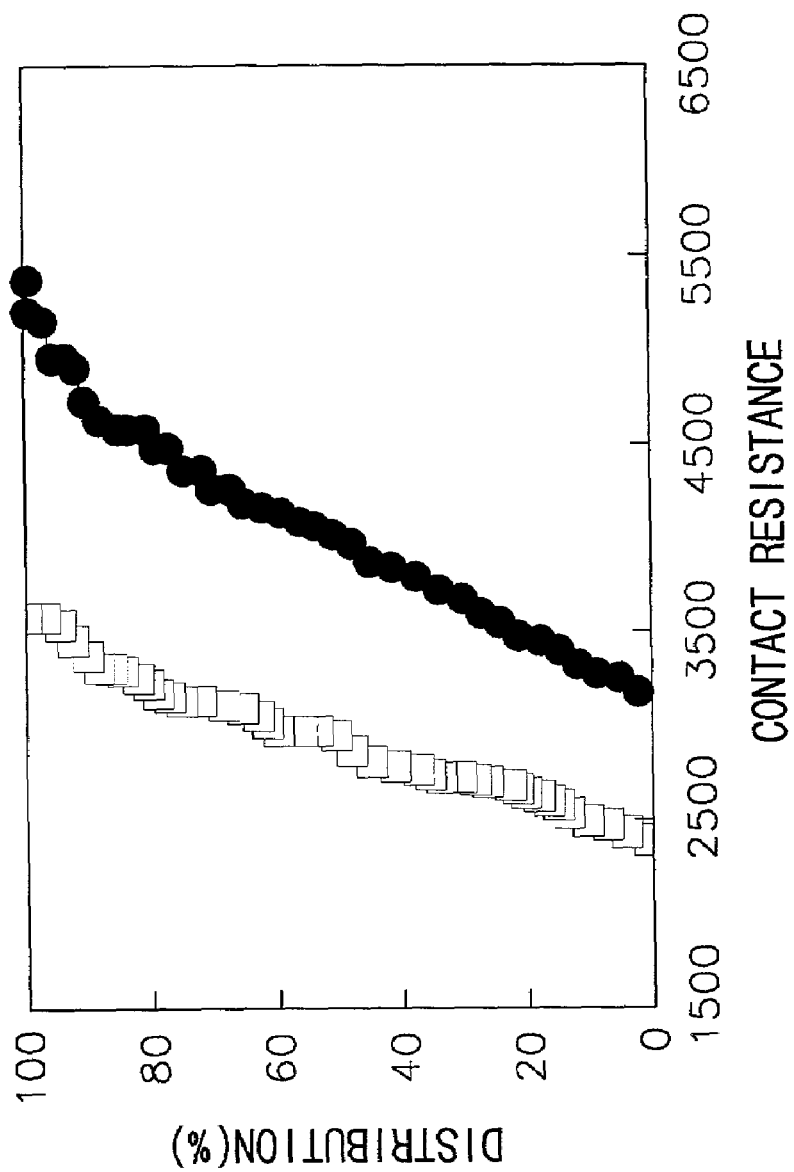
FIG. 15 is a graph showing the distribution of P+ contact resistance for the second hydrogen plasma treatment.

FIG. 15 is a graph showing the distribution of P+ contact resistance for the second hydrogen plasma treatment. Here, a symbol ● indicates the case where no hydrogen plasma treatment was performed, and a symbol ▲ indicates the case where the second hydrogen plasma treatment as described in the context of the second embodiment was performed.

From FIG. 15, it may be noted that the chlorine content in the titanium silicide layer decreased by H+ ions generated by the second hydrogen plasma treatment, thereby improving the contact resistance.

According to the present invention as described above, before depositing the refractory metal layer for use as the barrier layer, the first hydrogen plasma treatment is carried out in CVD or PECVD deposition chamber, such that impurities, such as fluorine and boron, included in the surface portion of the substrate are removed to suppress the formation of high resistance compounds and micro-voids, thereby reducing the contact resistance. Further, the native oxide layer formed on the substrate is removed by the first hydrogen plasma treatment, so that the in-situ pre-cleaning process can be performed without an additional cleaning chamber and a wet cleaning process for removing the native oxide layer may be eliminated. In addition, after depositing the refractory metal layer, the second hydrogen plasma treatment is carried out to remove impurities such as chlorine (Cl) atoms existing in the surface portion of the refractory metal silicide layer and to remove by-products such as $TiCl_x$ generated in the deposition chamber, which results in the reduction of the contact resistance.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of cleaning a surface of a silicon wafer doped with p-type impurities, comprising:
reducing a surface concentration the p-type impurities in the silicon wafer doped with the p-type impurities by subjecting the surface of the silicon wafer to a hydrogen ($H_2$) plasma containing at least one inert gas while biasing the hydrogen plasma with an RF bias power to direct the hydrogen ($H_2$) plasma onto the surface of the silicon wafer, wherein the surface of the silicon wafer is subjected to the hydrogen plasma at a temperature of greater than about 600° C. to evaporate the p-type impurities.

2. A method of cleaning a surface of a silicon wafer as claimed in claim 1, wherein the RF bias power is about 50 W to about 900 W.

3. A method of cleaning a surface of a silicon wafer as claimed in claim 2, wherein the RF bias power is a high frequency power at about 13 MHz to about 14 MHz.

4. A method of cleaning a surface of a silicon wafer as claimed in claim 1, wherein the hydrogen plasma is generated using an RF plasma power.

5. A method of cleaning a surface of a silicon wafer as claimed in claim 4, wherein the RF plasma power is about 200 W to about 900 W.

6. A method of cleaning a surface of a silicon wafer as claimed in claim 5, wherein the RF plasma power is a low frequency power at about 400 KHz to about 500 KHz.

7. A method of cleaning a surface of a silicon wafer as claimed in claim 1, wherein the at least one inert gas is an argon gas.

8. A method of cleaning a surface of a silicon wafer as claimed in claim 1, wherein the hydrogen plasma is generated using the at least one inert gas and hydrogen.

9. A method of cleaning a surface of a silicon wafer as claimed in claim 8, wherein a ratio of the at least one inert gas and hydrogen is about 1:9 to about 2:3.

10. A method of cleaning a surface of a silicon wafer as claimed in claim 1, wherein the surface of the silicon wafer is subjected to the hydrogen plasma for a period of time of about 5 seconds to about 5 minutes.

11. A method of cleaning a surface of a silicon wafer as claimed in claim 1, wherein the surface of the silicon wafer is subjected to the hydrogen plasma at a temperature between about 615° C. and about 650° C.

12. A method of cleaning a surface of a silicon wafer as claimed in claim 1, wherein the p-type impurities are boron.

* * * * *